US012713646B2

(12) United States Patent
Gao

(10) Patent No.: US 12,713,646 B2
(45) Date of Patent: Aug. 18, 2026

(54) POWER DEVICE WITH LOW GATE CHARGE AND LOW FIGURE OF MERIT

(71) Applicant: Infineon Technologies Americas Corp., El Segundo, CA (US)

(72) Inventor: Yang Gao, Milpitas, CA (US)

(73) Assignee: Infineon Technologies Americas Corp., El Segundo, CA (US)

( * ) Notice: Subject to any disclaimer, the term of this patent is extended or adjusted under 35 U.S.C. 154(b) by 706 days.

(21) Appl. No.: 17/192,585

(22) Filed: Mar. 4, 2021

(65) Prior Publication Data

US 2021/0193826 A1 Jun. 24, 2021

Related U.S. Application Data

(62) Division of application No. 16/296,760, filed on Mar. 8, 2019, now Pat. No. 10,957,791.

(51) Int. Cl.
*H10D 30/66* (2025.01)
*H10D 30/01* (2025.01)
(Continued)

(52) U.S. Cl.
CPC ......... *H10D 30/66* (2025.01); *H10D 30/0291* (2025.01); *H10D 62/152* (2025.01);
(Continued)

(58) Field of Classification Search
CPC ............. H01L 29/1058; H01L 29/1066; H01L 29/66893–66924; H01L 29/8086; H01L 2924/13062; H01L 27/098; H01L 27/14679; H01L 29/04–045; H01L 29/16–1608; H01L 29/18–185; H01L 29/22–2206; H01L 29/36–365; H01L 21/82285; H01L 21/823487; H01L 21/823885; H01L 27/0821; H01L 27/0828; H01L 27/10864; H01L 27/10876; H01L 29/66272; H01L 29/66666; H01L 29/66674; H01L 29/66712; H01L 29/732; H01L 29/7327; H01L 29/7371; H01L 29/7395; H01L 29/7788; H01L 29/7827; H01L 29/78642; H01L 29/7889; H01L 29/7926; H01L 29/8083; H01L 29/8122; H01L 23/5226; H01L 23/528;
(Continued)

(56) References Cited

U.S. PATENT DOCUMENTS

| | | | |
|---|---|---|---|
| 5,817,546 | A | 10/1998 | Ferla et al. |
| 5,877,515 | A | 3/1999 | Ajit |

(Continued)

FOREIGN PATENT DOCUMENTS

| | | | |
|---|---|---|---|
| CN | 103151375 | A | 6/2013 |
| EP | 1096573 | A2 | 5/2001 |
| WO | 2004066395 | A2 | 8/2004 |

*Primary Examiner* — Moin M Rahman
(74) *Attorney, Agent, or Firm* — Slater Matsil, LLP

(57) ABSTRACT

A device includes a cell, wherein each cell includes a body having a main top surface and a main bottom surface, a gate on the main surface on the device having a first length, a gate isolation layer over the gate having a second length at least twice as long as the first length, a source contact in the device body adjacent to the gate, a source metal layer over the gate isolation layer, and a drain on the main bottom surface of the cell.

20 Claims, 5 Drawing Sheets

(51) Int. Cl.
*H10D 62/13* (2025.01)
*H10D 64/23* (2025.01)
*H10B 20/00* (2023.01)

(52) U.S. Cl.
CPC ......... *H10D 62/156* (2025.01); *H10D 64/252* (2025.01); *H10B 20/367* (2023.02)

(58) Field of Classification Search
CPC ......... H01L 29/41775; H01L 29/42324; H01L 29/4234; H01L 21/02532; H01L 21/02636; H01L 21/31111; H01L 21/31155; H01L 21/76802; H01L 21/76877; H01L 21/76897; H01L 29/40114; H01L 29/40117; H01L 29/66545; H01L 29/7883; H01L 21/76831; H01L 21/76805; H01L 29/78; H01L 29/7802; H01L 29/0856; H01L 29/0873; H01L 29/41741; H01L 29/4238; H01L 29/0634; H01L 29/0696; H01L 29/0865; H01L 29/1095; H01L 29/401; H01L 29/42356; H01L 29/42364; H01L 21/02068; H01L 21/32134; H01L 21/32136; H01L 21/32137; H01L 21/3213; H01L 21/0228; H01L 21/76224; H01L 21/31116; H01L 21/30604; H01L 21/3065; H10B 43/27; H10B 41/27; H10B 41/30; H10B 43/30; H10B 43/40; H10B 43/10; H10B 43/50; H10B 41/35; H10B 41/50; H10B 43/35; H10B 41/41; H10B 41/10; H10B 41/20; H10B 41/40; H10B 41/44; H10B 41/43; H10B 41/42; H10B 43/00; H10B 43/20; H10B 43/23; H10B 51/00; H10B 51/10; H10B 51/20; H10B 51/30; H10B 51/40; H10B 51/50; H10B 53/10; H10B 53/20; H10B 53/22; H10B 63/30; H10B 63/32; H10B 63/34; H10B 63/80; H10B 63/84; H10B 99/00; H10B 99/10; H10B 99/22; H10B 20/367; H10D 30/66; H10D 30/0291; H10D 62/152; H10D 62/156; H10D 64/252; H10D 64/519; H10D 62/111; H10D 62/127; H10D 62/154; H10D 62/393; H10D 64/01; H10D 64/512; H10D 64/514; H10D 30/60–798; H10D 30/021–0415; H10D 84/83–859; H10D 62/364; H10D 84/0128; H10D 84/0167; H10D 62/85–854; H10D 30/751; H10D 30/027–0278; H10D 30/63; H10D 84/016; H10D 84/0195; H10D 30/501–509; H10D 84/0193; H10D 84/853; H10D 84/014; H10D 84/0158; H10D 84/0177; H10D 84/038; H10D 84/834; H10D 84/85; H10D 86/215; H10D 30/6215; H10D 30/0217; H10D 30/024; H10D 30/6728; H10D 30/6733; H10D 30/6735; H10D 62/118; H10D 89/931; H10D 84/0188; H10D 84/201; H10D 18/60; H10D 30/673; H10D 30/62; H10D 30/689; H10D 30/0323; H10D 30/6713; H10D 30/6744; H10D 30/6757; H10D 62/021; H10D 64/015; H10D 64/021; H10D 62/151; H10D 64/017; H10D 30/797; H10D 64/671; H02K 15/027; A23B 2/783; A45C 11/003; A61K 40/4218; H10F 77/955; H10H 20/826; B82Y 10/00
See application file for complete search history.

(56) References Cited

U.S. PATENT DOCUMENTS

| | | | | | |
|---|---|---|---|---|---|
| 6,048,759 | A | 4/2000 | Hshieh et al. | | |
| 6,236,083 | B1 | 5/2001 | McLachlan | | |
| 6,376,878 | B1 | 4/2002 | Kocon | | |
| 6,621,122 | B2 | 9/2003 | Qu | | |
| 6,791,143 | B2 | 9/2004 | Baliga | | |
| 6,853,033 | B2 | 2/2005 | Liang et al. | | |
| 7,504,676 | B2 | 3/2009 | Bhalla et al. | | |
| 7,651,918 | B2 | 1/2010 | de Fresart et al. | | |
| 8,466,510 | B2 | 6/2013 | Guan et al. | | |
| 8,692,324 | B2 | 4/2014 | Korec et al. | | |
| 8,829,614 | B2 | 9/2014 | Guan et al. | | |
| 9,082,845 | B1 | 7/2015 | Seok | | |
| 9,627,470 | B2 | 4/2017 | Song et al. | | |
| 9,647,059 | B2 | 5/2017 | Guan et al. | | |
| 10,388,737 | B2 | 8/2019 | Bolotnikov et al. | | |
| 2002/0175383 | A1* | 11/2002 | Kocon | H10D 62/393 | 257/376 |
| 2003/0006453 | A1* | 1/2003 | Liang | H10D 64/117 | 257/E29.259 |
| 2006/0249785 | A1 | 11/2006 | Bhalla et al. | | |
| 2007/0045727 | A1 | 3/2007 | Shiraishi et al. | | |
| 2007/0080379 | A1 | 4/2007 | Peake | | |
| 2008/0017916 | A1 | 1/2008 | Kanetaka | | |
| 2008/0246086 | A1* | 10/2008 | Korec | H10D 30/655 | 257/E29.066 |
| 2008/0272429 | A1* | 11/2008 | Ishiguro | H10D 30/66 | 257/E21.345 |
| 2009/0026539 | A1 | 1/2009 | Birner et al. | | |
| 2009/0176341 | A1 | 7/2009 | Saggio et al. | | |
| 2011/0017998 | A1 | 1/2011 | Nakano et al. | | |
| 2011/0042739 | A1 | 2/2011 | Cascio et al. | | |
| 2011/0049564 | A1* | 3/2011 | Guan | H01L 29/872 | 257/329 |
| 2012/0007104 | A1 | 1/2012 | Wada et al. | | |
| 2012/0193643 | A1 | 8/2012 | Masuda et al. | | |
| 2012/0248534 | A1* | 10/2012 | Huang | H01L 29/66727 | 257/341 |
| 2012/0256254 | A1* | 10/2012 | Huang | H01L 29/0653 | 257/329 |
| 2012/0280314 | A1 | 11/2012 | Parthasarathy et al. | | |
| 2013/0140633 | A1 | 6/2013 | Pattanayak | | |
| 2014/0045322 | A1 | 2/2014 | Tamaso | | |
| 2014/0138737 | A1 | 5/2014 | Bobde et al. | | |
| 2015/0162431 | A1 | 6/2015 | Zinn | | |
| 2015/0303300 | A1* | 10/2015 | Schillaci | H01L 29/4238 | 257/329 |
| 2016/0093733 | A1 | 3/2016 | Banerjee et al. | | |
| 2016/0240649 | A1* | 8/2016 | Titus | H10D 30/615 | |
| 2020/0258996 | A1* | 8/2020 | Ohse | H01L 21/0485 | |

* cited by examiner 100
120
118
122

100
102
104
103
110
116
103
110
108B
112
106
114
108A
112

200
218
222

200
202
203
204
206
208
210
212
214
216

700

|  | BV | POLY LENGTH (L') | Ron | Qgs | Qgd | Qg | FOM (Qg*Ron) |
|---|---|---|---|---|---|---|---|
|  | V | μm | mΩ | nC | nC | nC | mΩ-nC |
| SIMULATED | 250 | 3.6 | 80.5 | 7.4 | 4.8 | 28.8 | 2318 |
| MEASURED |  |  | 89.7 | 11.1 | 4 | 26.4 | 2368 |
| SIMULATED |  | 1.8 | 85.5 | 4.9 | 2.9 | 18.4 | 1573 |
| MEASURED |  |  | 93.7 | 7 | 2.7 | 15 | 1406 |
| SIMULATED |  | 1.4 | 86 | 3.9 | 1.5 | 14.5 | 1274 |
| MEASURED |  |  | N/A |  |  |  |  |

-40%

600

| TECHNOLOGY | POLY LENGTH | BV | Ron WITH PACKAGE | VT | Qgs | Qgd | Qg | Ciss | Coss | Crss | FOM (Ron * Qg) | FOM IMPROVEMENT |
|---|---|---|---|---|---|---|---|---|---|---|---|---|
| | μm | V | mΩ | V | nC | nC | nC | pF | pF | pF | mΩ-nC | |
| ONE SOURCE CONTACT | 1.0 | 100 | 33 | 2.8 | 5.7 | 0.5 | 10.8 | 638 | 426 | 0.7 | 356 | 56% |
| | 1.4 | | 31 | | 7.1 | 1.7 | 14.2 | 743 | 426 | 2 | 440 | 45% |
| | 1.8 | | 31 | | 8.8 | 3 | 18.5 | 833 | 425 | 3.3 | 574 | 28% |
| | 2.2 | | 31 | | 10.2 | 4.2 | 21.9 | 920 | 423 | 4 | 679 | 14% |
| TWO SOURCE CONTACT | 3.6 | | 26 | 2.7 | 12 | 5.6 | 30.3 | 1465 | 422 | 4 | 788 | 0% |

FIG. 6

POWER DEVICE WITH LOW GATE CHARGE AND LOW FIGURE OF MERIT

This application is a divisional of U.S. patent application Ser. No. 16/296,760, filed Mar. 8, 2019, application is hereby incorporated herein by reference.

TECHNICAL FIELD

The present invention relates generally to a power device comprising a low Figure of Merit ("FOM").

BACKGROUND

For VDMOS (Vertical, double-Diffused, Metal-Oxide, Semiconductor) devices used as power switches, gate charge Qg plays an important role for generating switching loss. In general, it is desirable to achieve the lowest gate charge Qg possible for maximum switching performance. The RQg FOM thus determines switching performance in terms of conduction and gate drive power loss, and is represented by the equation RQg FOM=(Rds(on)×Qg). As previously noted, FOM should be minimized. Current VDMOS has relatively high Qg and thus a high FOM, which results in power loss, especially for applications in which switching loss is dominant.

One method for evaluating MOSFET (Metal-Oxide Semiconductor Field-Effect Transistor) devices is by comparing the FOM or Figure of Merit. One simple FOM is the RQg FOM. In its simplest form, the RQg figure of merit includes gate charge (Qg) multiplied by the "on" resistance between the drain and source of the device (Rds(on)). The result of this multiplication generates the RQg FOM, which can then be used to compare devices or certain device technologies. In general, a lower RQg FOM corresponds to a lower switching loss.

Methods have been tried to reduce the Qg without significantly increasing Rds(on). One typical approach is to have planar "split gate" structure by removing the gate polysilicon on the top of a JFET (Junction Field-Effect Transistor) neck. In this case, gate to drain overlap is significantly reduced. While both Qg (gate charge) and Qgd (gate to drain charge) will both decrease but Rds(on) is increased. In addition, the "split gate" approach has a minimal impact on Qgs (gate to source charge), which is also important in determining device switching performance.

SUMMARY

A device comprises a cell, wherein each cell comprises a body comprising a main top surface and a main bottom surface; a gate on the main surface on the device having a first length; a gate isolation layer over the gate having a second length at least twice as long as the first length; a source contact in the device body proximate to the gate; a source metal layer over the gate isolation layer; and a drain on the main bottom surface of the cell.

BRIEF DESCRIPTION OF THE DRAWINGS

For a more complete understanding of the present invention, and the advantages thereof, reference is now made to the following descriptions taken in conjunction with the accompanying drawings, in which:

FIG. 6 is a table of simulation results for a plurality of boy SJ VDMOS devices comprising different polysilicon gate lengths according to embodiments.

DETAILED DESCRIPTION OF ILLUSTRATIVE EMBODIMENTS

According to embodiments, methods, transistor cells, and transistor devices comprising a plurality of transistor cells are described that are configured to reduce the Qg without significantly increasing Rds(on), thus improving FOM. By removing one of the two source contacts in a conventional SJ VDMOS device cell while maintaining the other device structures, the polysilicon gate length is significantly reduced and FOM is improved. Embodiment concepts can be adapted to other device types as well. For example, any vertical device having two symmetrical source contacts can modified as described herein. The device cells can be replicated in two or more configurations while maintaining the improvement in FOM according to embodiments.

Figure 1B:
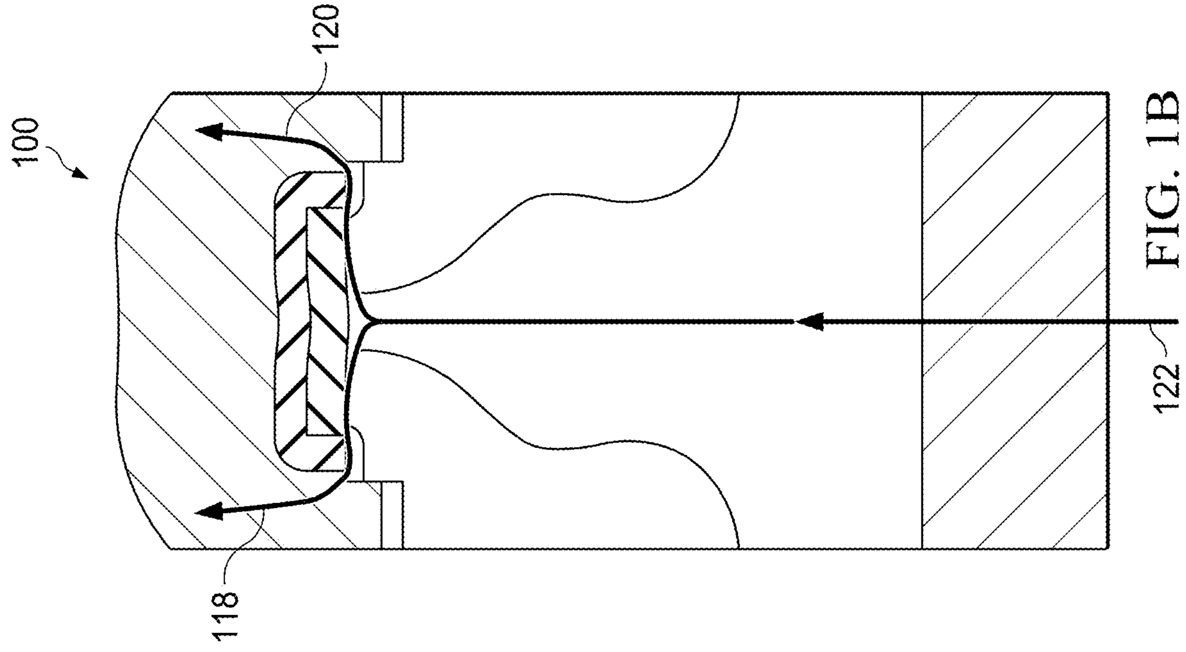
FIG. 1B is a cross-sectional view of the SJ VDMOS device of FIG. 1A, including an indication of the vertical current flow within the device in an active mode of operation.
Figure 1A:
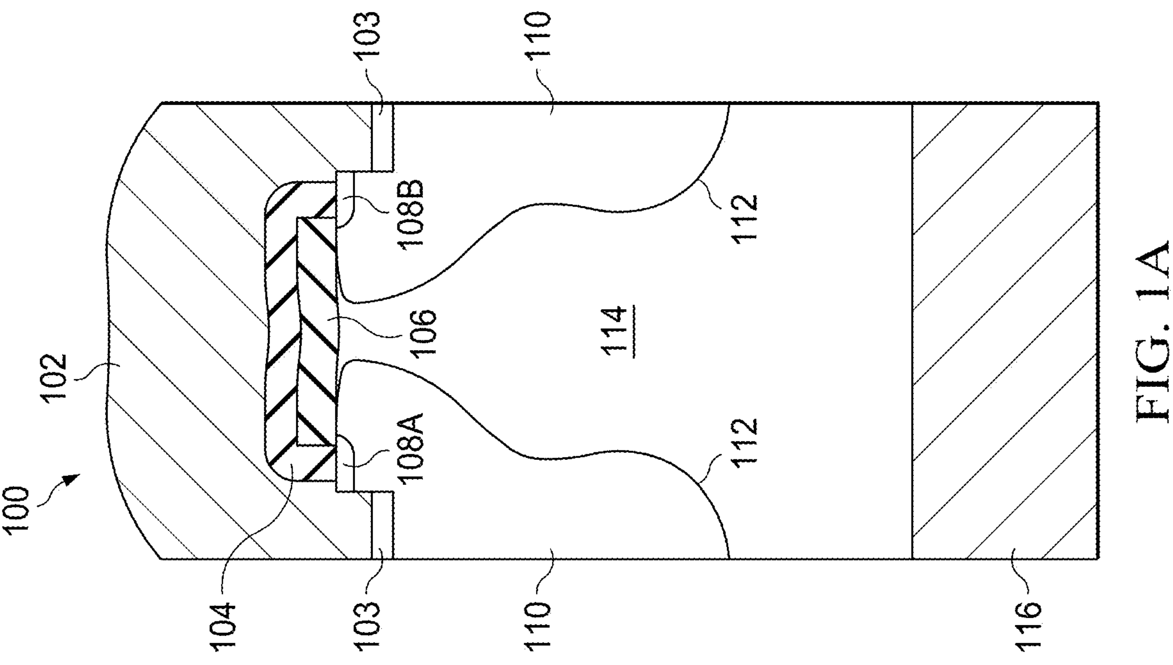
FIG. 1A is a cross-sectional view of a Super Junction ("SJ") VDMOS device according to the prior art.

FIG. 1A is a cross-sectional view of an exemplary SJ VDMOS device cell 100 including a source metal region 102, a gate insulation layer 104, an insulated gate 106, source contacts 108A and 108B, a body region including zones 110 and 114, an interface 112 between zones 110 and 114, and a drain contact 116. Source metal region 102 can be formed of aluminum or other conductive materials. A dielectric layer such as silicon dioxide or other dielectric materials can be used for gate insulation layer 104. Insulated gate 106 can comprise a polysilicon or an aluminum gate surrounded by a dielectric layer such as silicon dioxide or other dielectric materials. Source contacts 108A and 108B can include a diffused region in the body of the device cell 100, for example an N+ type diffused region. Source contacts 108A and 108B can be diffused into another diffused region, for example, a P− base region for forming a channel region. Zones 110 can comprise P-type columns and zone 114 can comprise an N-type epitaxial region. Zones 110 and 114 will support reverse bias voltages when the device is in OFF state. Interface 112 comprises a PN junction between zones 110 and 114 where a depletion region is formed on each side of junction 112 when the device is in the OFF state. Drain contact 116 can be a metallized bottom surface of device cell 100, such as aluminum or aluminum alloys. The body of device cell 100 can include an N− drift region in the epitaxial region over an N+ substrate. Zones 110 also include a P+ contact 103 that is shorted to the source metal region 102 as shown.

FIG. 1B is a cross-sectional view of the SJ VDMOS device cell 100 of FIG. 1A, including an indication of the vertical current flow 118, 120, and 122 within the device in an active mode of operation. Not all of the reference numerals are replicated in FIG. 1B for simplicity in understanding the drawing figures. The main path 122 of the current flow through the body of device cell 100 splits into two equal branches, including current branch 118 that flows up to the main top surface of the device and across a first channel to the first source contact 108A and current branch 120 that flows up to the main top surface of the device and across a second channel to the second source contact 108B. Current branch 122 represents the total vertical current flow through the device, and current branches 118 and 120 each represent about half of the total vertical current flow through the device.

Thus, device cell 100 includes N+ source contacts 108A and 108B on both sides of the polysilicon gate 106. Drain current flows to each N+ source contact through left channel and right channels during conduction.

It is known in the art that a plurality of device cells are replicated in a pattern of, for example, rows and columns and interconnected to complete an entire power device.

Figure 2B:
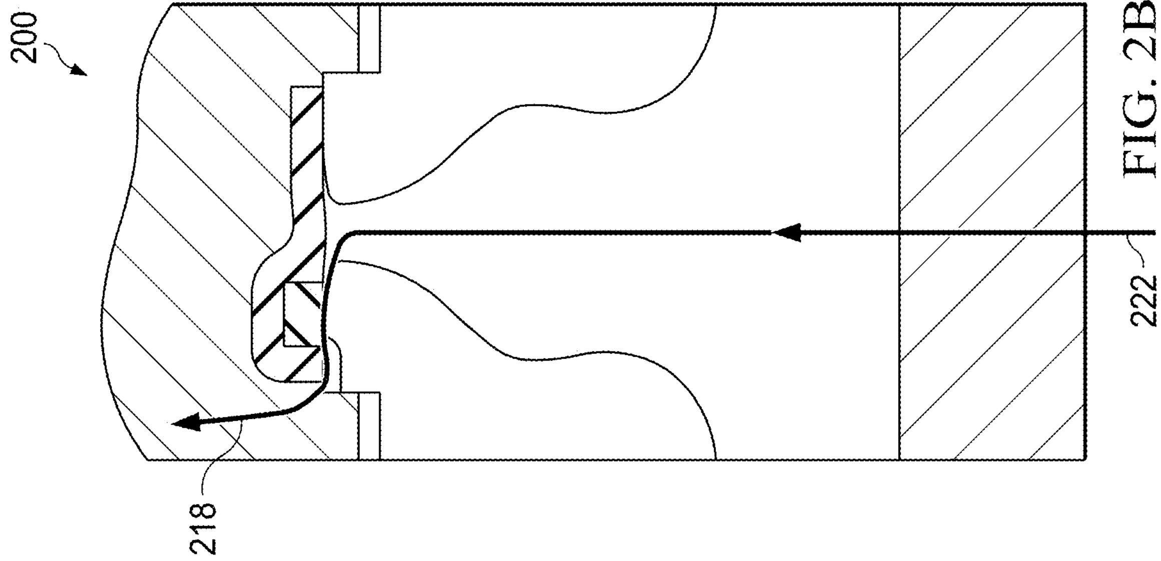
FIG. 2B is a cross-sectional view of the SJ VDMOS device of FIG. 2A, including an indication of the vertical current flow within the device in an active mode of operation.
Figure 2A:
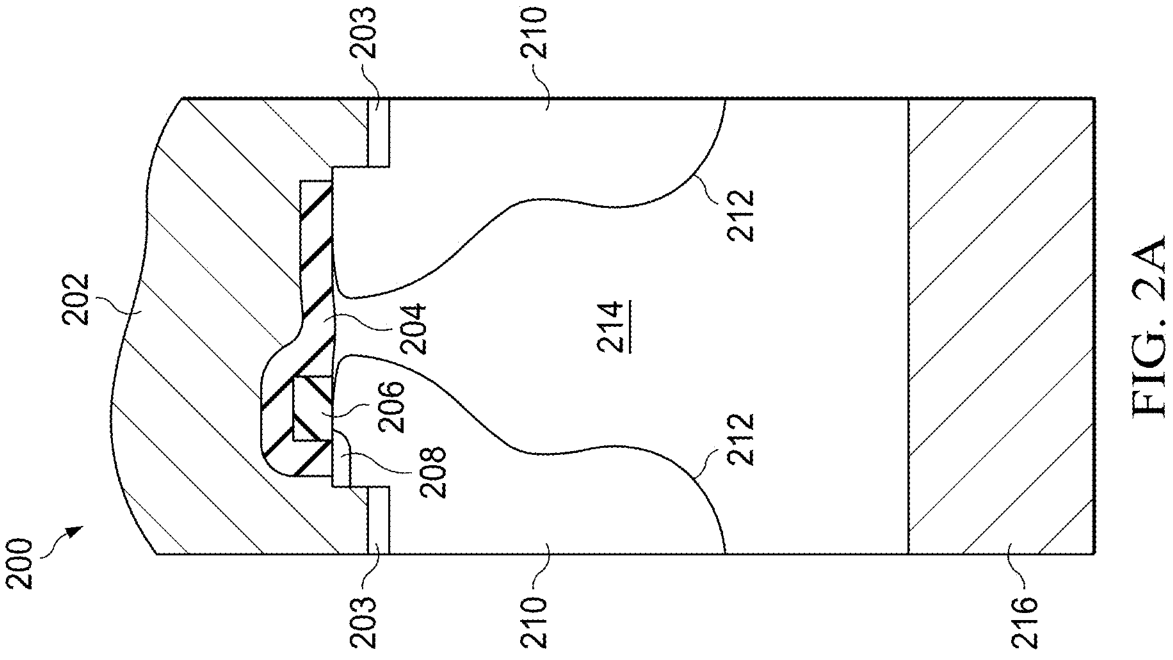
FIG. 2A is a cross-sectional view of a SJ VDMOS device including an improved FOM according to an embodiment.

FIG. 2A is a cross-sectional view of a SJ VDMOS device cell 200 including an improved FOM according to an embodiment including a source metal region 202, a gate insulation layer 204, a single insulated gate 206, a single source contact 208, a body region including zones 210 and 214, an interface 212 between zones 210 and 214, and a drain contact 216. Source metal region 202 can comprise aluminum or other conductive materials. Gate insulation layer 204 can comprise a dielectric layer such as silicon dioxide or other dielectric materials. Insulated gate 206 can comprise a polysilicon or an aluminum gate surrounded by a dielectric layer such as silicon dioxide or other dielectric materials. Source contact 208 can comprise a diffused region in the body of the device cell 200, for example an N+ diffused region. Source contact 208 can be diffused into another diffused region, for example, a P-base region for forming a channel region. Zones 210 can comprise P-type columns and zone 214 can comprise an N-type epitaxial region. Zones 210 and 214 will support reverse bias voltages when the device is in OFF state. Interface 212 comprises a PN junction between zones 210 and 214 where a depletion region is formed on each side of junction 212 when the device is in the OFF state. Drain contact 216 can be a metallized bottom surface of device cell 200, such as aluminum or aluminum alloys. The body of device cell 200 can include an N− drift region in an epitaxial region over an N+ substrate. Zones 210 also include a P+ contact 203 that is shorted to the source metal region 202 as shown.

Note that the single insulated gate 206 and the single source contact 208 are asymmetrically arranged with respect to gate insulation layer 204. In various embodiments, insulated gate 206 and source contact 208 each have lengths less than one-half that of the length of the gate insulation layer 204. In some embodiments, insulated gate 206 and source contact 208 each have lengths less than one-third that of the length of the gate insulation layer 204. In an embodiment, the length of the polysilicon gate 206 can be a minimum length, thus reducing the corresponding gate to drain overlap.

FIG. 2B is a cross-sectional view of the SJ VDMOS device cell 200 of FIG. 2A, including an indication of the vertical current flow 222, 218 within the device in an active mode of operation. Not all of the reference numerals are replicated in FIG. 2B for simplicity in understanding the drawing figures. The main path 222 of the current flow through the body of device cell 200 includes a single current branch 218 that flows up to the main top surface of the device and across a channel to the single source contact 208. Current branches 222 and 218 thus represent the same total vertical current flow through the device.

In comparing device cell 200 with exemplary device cell 100, gate charges Qg and Qgd are significantly reduced and a much lower FOM (Rds(on)×Qg) is realized. A slightly higher specific Rds(on) (Rds(on)×AA) is realized, where AA is the Active Area of the SJ VDMOS device. Comparing device cell 200 with prior art device cell boo, only half of the source contact length is used (208 vs 108A and 108B) and the single source contact 208 is asymmetrically located with respect to the gate insulation layer 204. In addition, the length of polysilicon gate 206 is significantly reduced with respect to polysilicon gate 106. For example, in an embodiment the length of polysilicon gate 206 can be less than one-half that of polysilicon gate 106. In another embodiment the length of polysilicon gate 206 can be less than one-third that of polysilicon gate 106. In another embodiment the length of polysilicon gate can be a minimum gate length based on critical dimensions of a given semiconductor manufacturing process.

Both device cells 100 and 200 have the same P+ contacts 103 and 203 that are shorted to the corresponding source metal regions 102 and 202 as previously described. Removing one of the N+ contacts and/or shrinking the gate polysilicon length in device cell 200 does not alter the source to drain overlap, which is corroborated below with respect to the simulation and measurement results shown in FIGS. 6 and 7. With respect to device cell 200, the source metal coupling to the P+ contact 203 on the right hand side of the device cell is important even though no current flows in that side of the device cell. The voltage on the P+ contact 203 sets the voltage of top of zone 110 to ground when the device is in a reverse bias condition. If the P+ contact 203 is removed on that side, zone 110 would be electrically floating and the breakdown voltage of the device cell would be lower.

Figures 3, 4:
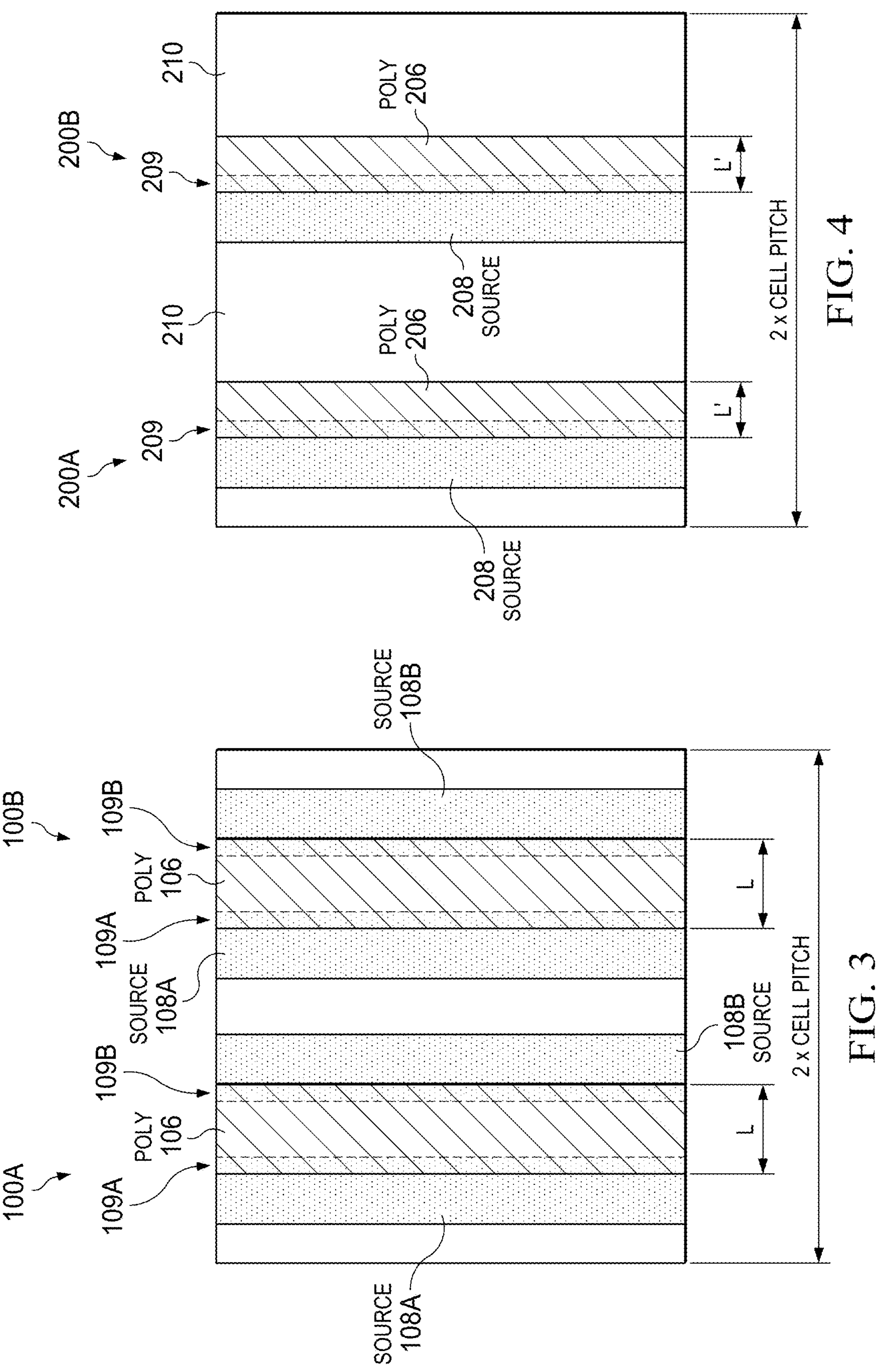
FIG. 3 is a plan view of the device of FIG. 1A and FIG. 1B.
FIG. 4 is a plan view of the device of FIG. 2A and FIG. 2B arranged in a first configuration according to an embodiment.

FIG. 3 is a plan view of the device cell 100 of FIG. 1A and FIG. 1B. For simplicity only the outline of a cell including two device cells 100A and 100B is shown, where the first device cell 100A includes a first source contact stripe 108A, a second source contact stripe 108B, and a polysilicon gate stripe 106 corresponding to the same features shown in FIG. 1A and FIG. 1B. Gate stripe 106 has a first edge 109A that overlaps an edge of source stripe 108A and a second edge 109B that overlaps an edge of source stripe 108B.

The second device cell 100B also includes a first source contact stripe 108A, a second source contact stripe 108B, and a polysilicon gate stripe 106 corresponding to the same features shown in FIG. 1A and FIG. 1B. Gate stripe 106 of second device 100B also has a first edge 109A that overlaps an edge of source stripe 108A and a second edge 109B that overlaps an edge of source stripe 108B.

The total cell pitch of both of the device cells 100A and 100B (“2×cell pitch”) is shown in FIG. 3 and “L” is also shown, which is the length for the polysilicon gate for each device.

FIG. 4 is a plan view of the device of FIG. 2A and FIG. 2B. For simplicity only the outline of a cell including two device cells 200A and 200B is shown, wherein the first device cell 200A includes a single source contact stripe 208 and a polysilicon gate stripe 206 corresponding to the same features shown in FIG. 2A and FIG. 2B. Gate stripe 206 has a first edge 209 that overlaps an edge of source stripe 208.

The second device cell 200B also includes a single source contact stripe 208 and a polysilicon gate stripe 206 corresponding to the same features shown in FIG. 2A and FIG. 2B. Gate stripe 206 of second device cell 200B also has a first edge 209 that overlaps an edge of source stripe 208.

The total cell pitch of both device cells 200A and 200B ("2×cell pitch") is shown in FIG. 4 and "L'" is also shown, which is the length of the polysilicon gate for each device. The gate polysilicon length in the prior art device cells 100A and 100B of FIG. 3 is "L", wherein the gate polysilicon length of device 200 shown in FIG. 4 is "L'", wherein L'<L in an embodiment.

Note that device cells 200A and 200B include "charge reduction stripes" 210 that are not associated with directing the vertical current flow of the device, and do not include either a source stripe 208 or a gate stripe 206. A source implant is performed on both sides of the polysilicon gate in the prior art device, while only a single-sided source implant is performed in the devices shown in FIGS. 2A, 2B, and 4 according to an embodiment. The "charge reduction stripe" 210 thus does not include the source implant.

FIG. 4 shows a cell layout for a power device wherein each cell comprises a source 208 and an overlapping polysilicon gate 206. A charge reduction stripe 210 separates cell 200A from the next cell 200B, which also comprises a source 208 and an overlapping polysilicon gate 206 in the same order.

Figures 5, 7:
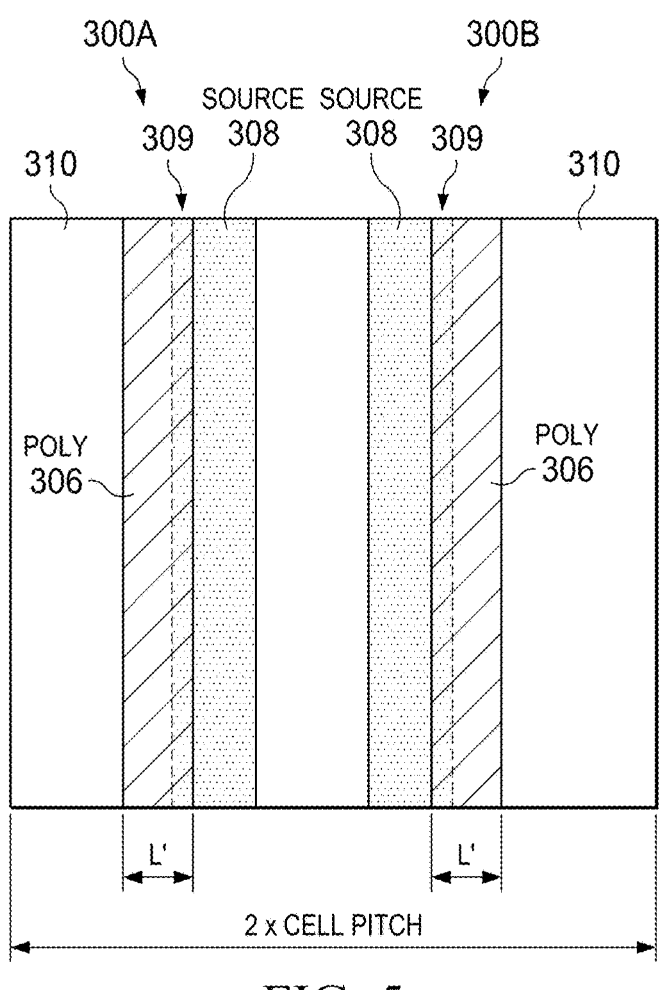
FIG. 5 is a plan view of the device of FIG. 2A and FIG. 2B arranged in a second configuration according to an embodiment.
FIG. 7 is a table of simulation and measurement results for a plurality of 250V SJ VDMOS devices comprising different polysilicon gate lengths according to embodiments.

FIG. 5 shows a cell layout for a power device wherein each cell is "flipped" horizontally with respect to the adjacent cell. For example, cell 300A comprises a polysilicon gate 306 including portion 309 overlapping a source 308, and a charge reduction stripe 310. Cell 300A is separated from the next cell 300B, which comprises a flipped configuration comprising, in order, a source 308 and an overlapping polysilicon gate 306 including overlap portion 309, and a charge reduction stripe 310.

FIG. 5 is a plan view of the device of FIG. 2A and FIG. 2B shown in an alternative layout configuration according to another embodiment. For simplicity only the outline of a cell including two devices 300A and 300B is shown, wherein the first device 300A includes a single source contact stripe 308 and a polysilicon gate stripe 306 corresponding to the same features shown in FIG. 2A and FIG. 2B. Gate stripe 306 has a first edge that overlaps an edge of source stripe 308. Cell 300A includes, in order from left to right, a gate stripe 306 followed by a source stripe 308.

The second cell 300B also includes a single source contact stripe 308 and a polysilicon gate stripe 306 corresponding to the same features shown in FIG. 2A and FIG. 2B. Gate stripe 306 of second cell 200B also has a first edge that overlaps an edge of source stripe 308. Cell 300B includes, in order from left to right, a source stripe 308 followed by a gate stripe 306 in a flipped configuration with respect to cell 300A.

While layout configurations can use the cell layouts shown in FIGS. 4 and 5 repeated in the same orientation throughout an array of such cells, other layout configurations are possible. For example, other configurations wherein a number of cells having the same source/gate or gate/source configuration, for example three, four, or more having the same source/gate configuration or gate/source configuration can be repeated in order. A macrocell can then be designated having the three, four, or more repeated cells. The macrocell can itself be repeated or flipped as desire when constructing the finished power device. Those skilled in the art will realize that many such repeated configurations can be achieved for a power device using the cells shown in FIG. 4, FIG. 5, or a mixture of those shown in FIGS. 4 and 5. The flipping of the cells or macrocells can be done in both the X-axis and Y-axis directions as desired.

FIG. 6 is a table 600 of simulation results for a plurality of SJ VDMOS devices comprising different polysilicon gate lengths according to embodiments. Four simulations were run for single source contact embodiments having gate lengths of 1 μm, 1.4 μm, 1.8 μm, and 2.2 μm. For comparison, a simulation was run for an exemplary device having two source contacts with a total gate length of 3.6 μm.

Table 600 is based on a boy BV (Breakdown Voltage datasheet rating) SJ VDMOS platform, which summarizes FOM related device parameters. A significant reduction of Qg (gate charge Qg is defined as the charge from zero to the point at which the driving voltage Vgs equals the actual gate voltage of the device), Ciss (effective input capacitance seen by the gate drive circuit, Ciss=Cgs+Cgd with Cds shorted), Crss (reverse transfer capacitance, Crss=Cgd, which is also called Miller Capacitance), and FOM (Figure of Merit: Rds(on)×Qg) achieved when comparing the single source stripe device to the exemplary dual source stripe device. Also shown in FIG. 6 is the output capacitance Coss. The simulated value of the output capacitance Coss is not significantly affected by the gate length and number of source contacts since a P+ source contact remains where the N+ source contact has been removed. Furthermore, Coss is not significantly changed since the drain side of the device cell is not changed, such that the source to drain overlap not changed.

The FOM percentage reduction is a function of polysilicon gate length. In a specific range, the shorter the length, the more the improvement in FOM. While the polysilicon gate length can be reduced to the minimum amount, this may cause a corresponding increase in Rds(on). Thus, in some embodiments the polysilicon gate length is chosen to be above the minimum length geometry offered by the manufacturing technology used, since Rds(on) will be on the border of starting to increase dramatically which will be more dominant than the Qg reduction so FOM will be the same or even higher so it is not possible to push this parameter to a point that even small variation will affect device parameters dramatically.

FIG. 7 is a table 700 of simulation and measurement results for a plurality of VDMOS devices comprising different polysilicon gate lengths according to embodiments. Table boo uses a 250V BV (Breakdown Voltage datasheet rating) platform, showing a significant reduction of Qg (gate charge), Qgs (gate to source charge), Qgd (gate to drain charge), and FOM (Figure of Merit) achieved when comparing the single source stripe device to the conventional dual source stripe device. Also shown in FIG. 7 is the Rds(on) resistance, which shows only a slight increase in resistance. Based on measured data, a 40% FOM improvement has been achieved when the polysilicon length is reduced by half. Similar to the 100V case shown in FIG. 5, further FOM reduction can be achieved by further shrinking the polysilicon gate length in a range that is allowed by the corresponding process window.

Compared to the exemplary devices shown in FIGS. 1A, 1B, and 3, the device embodiments shown in FIGS. 2A, 2B, 4, and 5 include a source contact only on one side of the polysilicon gate. There is no source contact on the other side of the polysilicon gate, according to the embodiments shown and described herein. The polysilicon gate length is thus significantly reduced, whose length is used to make sure that the channel is turned on/off during switching but having minimum overlap with drain. (The N-epitaxial layer described above is also part of the drain side since it is connected to the drain through the N-type doping.) Thus Qgd (gate to drain charge) is much improved. Further, there is no polysilicon on top of the P-body region on the side where the N+ source contact is removed. Thus, there is no inversion layer when the device is turned on. As a result, gate to source overlap is reduced to half, which results in half of Qgs (gate to source charge). Total Qg (gate charge) is thus significantly reduced, with a small corresponding increase is Rds(on). Since the percentage of Rds(on) increase is less than the decrease of Qg, the FOM is significantly reduced.

Thus, embodiments have been described wherein, with respect to the two source contact exemplary devices, half of the source contact and corresponding channel have been removed, and the length of the polysilicon gate has been reduced. Devices according to embodiments described herein exhibit improved performance and lower FOMs due to the reduction of Qg being more than the increase of Rds(on).

Device embodiments can be used in small power converters because the circuits used in the small power converters are normally are single ended and subject to hard switching. Device embodiments can also be used in low voltage applications, especially when switching loss is dominant (e.g., the top switch of buck converter). Device embodiments can also be used in combination with conventional devices, for example as a top switch and the conventional device as bottom switch (where conduction loss is dominant) for optimal efficiency.

When constructing a power device, a plurality of cells as shown in FIGS. 2A, 2B, 4, and 5 may be used, in any orientation. However, a plurality of cells as shown in FIGS. 1A, 1B, and 3 may also be used, in any orientation, to create a power device having a mixture of cell types. Such a mixture of cells types may be used to achieve a specific FOM in an embodiment.

In an example, a device comprises a cell, wherein each cell comprises: a body comprising a main top surface and a main bottom surface; a gate on the main surface on the device having a first length; a gate isolation layer over the gate having a second length at least twice as long as the first length; a source contact in the device body proximate to the gate; a source metal layer over the gate isolation layer; and a drain on the main bottom surface of the cell. The device can comprise a plurality of substantially identical cells, wherein the gate is asymmetrical with respect to the gate isolation layer, and wherein the source contact is asymmetrical with respect to the gate isolation layer. The second length can be at least three times as long as the first length. The gate can comprise a minimum length gate, and can comprise a polysilicon gate.

In another example, a device comprises a cell, wherein each cell comprises: a gate stripe having a first edge and a second edge; a source stripe extending along and being overlapped by the first edge of the gate stripe; and a charge reduction stripe extending along the second edge of the gate stripe. The device can comprise a plurality of substantially identical cells, and further comprises forming a channel underneath the gate stripe in an active mode of operation, and not forming a channel underneath the charge reduction stripe in the active mode of operation. A length of the charge reduction stripe is greater than a length of the source stripe or the gate stripe. The gate stripe can comprise a minimum length gate stripe, and can comprise a polysilicon gate stripe.

An example method of fabricating a device cell comprises forming a gate on a main surface of the device cell having a first length; forming a gate isolation layer over the gate having a second length at least twice as long as the first length; forming a source contact proximate to the gate; forming a source metal layer over the gate isolation layer; and forming a drain on a main bottom surface of the device cell. The example method comprises forming a plurality of substantially identical cells, wherein the gate is formed asymmetrically with respect to the gate isolation layer, and wherein the source contact is formed asymmetrically with respect to the gate isolation layer. Forming the gate can comprise forming a minimum length gate and can comprise forming a polysilicon gate.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of fabricating a device cell, the method comprising:

forming only one instance of a structure on a main surface of the device cell, the structure having a first length;

forming a gate isolation layer on the main surface of the device cell over the structure having a second length at least twice as long as the first length, wherein the gate isolation layer is disposed over no more than the one instance of the structure, and wherein the structure comprises an unsegmented gate that is offset from a center of the device cell in a lateral direction toward a first side of the device cell;

forming a single source contact on a side of the device cell that is proximate to the unsegmented gate, wherein a second side of the device cell opposite the first side is free from any source contact;

forming a source metal layer over the gate isolation layer; and forming a drain on a main bottom surface of the device cell, wherein the device cell is disposed in a laterally symmetric body between the main surface and the main bottom surface, wherein the laterally symmetric body comprises a first column of a first doping type proximate to the unsegmented gate comprising the single source contact, a second column of the first doping type that is remote from the unsegmented gate, and a central zone of a second doping type opposite the first doping type between the first column and the second column, wherein the second column comprises a body contact region having an upper surface vertically spaced below a bottom surface of the gate isolation layer, wherein the source metal layer electrically connects the first column and the second column, and wherein the unsegmented gate is formed asymmetrically with respect to the gate isolation layer in a lateral direction parallel to the main surface of the device cell.

2. The method of claim 1, wherein the single source contact is formed asymmetrically with respect to the gate isolation layer.

3. The method of claim 1, wherein forming the unsegmented gate comprises forming a minimum length gate.

4. The method of claim 1, wherein forming the unsegmented gate comprises forming a polysilicon gate.

5. A method of forming a device comprising a device cell, wherein each cell comprises a body comprising a main top surface and a main bottom surface, the method comprising:

forming only one instance of an unsegmented gate on the main top surface of the device having a first length, wherein the unsegmented gate is offset from a center of the device cell in a lateral direction toward a first side of the device cell;

forming a gate insulation layer over the unsegmented gate having a second length at least twice as long as the first length, the gate insulation layer having a first portion directly over the unsegmented gate and a second portion directly over the main top surface of the body;

forming a single source contact on a side of the body that is proximate to the unsegmented gate, wherein a second side of the device cell opposite the first side is free from any source contact;

forming a source metal region over the gate insulation layer; and forming a drain contact on the main bottom surface of the body, wherein the body comprises an N-type epitaxial layer extending from the main top surface of the body to the main bottom surface of the body, a first P-type column disposed below the first portion of the gate insulation layer extending from the main top surface of the body and only partially into the N-type epitaxial layer, and a second P-type column disposed below the second portion of the gate insulation layer extending from the main top surface of the body and only partially into the N-type epitaxial layer, wherein the unsegmented gate is formed with lateral asymmetry with respect to the gate insulation layer in a lateral direction parallel to the main top surface, and wherein the body is formed with lateral symmetry, wherein the first P-type column comprises the single source contact, and the source metal region electrically connects the first P-type column and the second P-type column, and wherein the second P-type column comprises a body contact region having an upper surface vertically spaced below a bottom surface of the gate insulation layer.

6. The method of claim 5, wherein forming the single source contact comprises forming the single source contact with one of the first P-type column or the second P-type column.

7. The method of claim 5, wherein the single source contact is formed asymmetrically with respect to the gate insulation layer.

8. The method of claim 5, wherein the second length is at least three times as long as the first length.

9. The method of claim 5, wherein forming the unsegmented gate comprises forming a minimum length gate.

10. The method of claim 5, wherein forming the unsegmented gate comprises forming a polysilicon gate.

11. A method of forming a device comprising a device cell, wherein each cell comprises a body comprising a main top surface and a main bottom surface, the method comprising:

forming only one instance of an unsegmented gate on the main top surface of the device having a first length, wherein the unsegmented gate is offset from a center of the device cell in a lateral direction toward a first side of the device cell;

forming a gate insulation layer over the unsegmented gate having a second length at least twice as long as the first length, the gate insulation layer having a first portion directly over the unsegmented gate and a second portion directly over the main top surface of the body;

forming a single source contact on a side of the body that is proximate to the unsegmented gate, wherein a second side of the device cell opposite the first side is free from any source contact;

forming a source metal region over the gate insulation layer; and forming a drain contact on the main bottom surface of the body, wherein the body comprises an N-type epitaxial layer extending from the main top surface of the body to the main bottom surface of the body between a first P-type column below the first portion of the gate insulation layer and a second P-type column below the second portion of the gate insulation layer, and wherein the unsegmented gate is formed with lateral asymmetry with respect to the gate insulation layer in a lateral direction parallel to the main top surface, and wherein the body is formed with lateral symmetry, and wherein the first P-type column comprises the single source contact, and the source metal region electrically connects the first P-type column and the second P-type column, and wherein the second P-type column comprises a body contact region having an upper surface vertically spaced below a bottom surface of the gate insulation layer.

12. The method of claim 11, wherein forming the single source contact comprises forming the single source contact with one of the first P-type column or the second P-type column.

13. The method of claim 11, wherein the single source contact is formed asymmetrically with respect to the gate insulation layer.

14. The method of claim 11, wherein the second length is at least three times as long as the first length.

15. The method of claim 11, wherein forming the unsegmented gate comprises forming a minimum length gate.

16. The method of claim 11, wherein forming the unsegmented gate comprises forming a polysilicon gate.

17. The method of claim 1, wherein the device cell comprises a vertical double-doped metal oxide semiconductor (VDMOS) transistor.

18. The method of claim 5, wherein the device comprises a vertical double-doped metal oxide semiconductor (VDMOS) transistor.

19. The method of claim 11, wherein the device comprises a vertical double-doped metal oxide semiconductor (VDMOS) transistor.

20. The method of claim 1, wherein the gate isolation layer has a curved upper surface profile that rises over the unsegmented gate.

* * * * *